United States Patent
Benwadih et al.

(10) Patent No.: US 10,900,847 B2
(45) Date of Patent: Jan. 26, 2021

(54) THERMAL PATTERN SENSOR WITH PYROELECTRIC CAPACITOR COMPRISING A SOL-GEL MATRIX AND METALLIC OXIDE PARTICLES

(71) Applicant: COMMISSARIAT À L'ÉNERGIE ATOMIQUE ET AUX ÉNERGIES ALTERNATIVES, Paris (FR)

(72) Inventors: Mohammed Benwadih, Champigny sur Marne (FR); Christine Revenant-Brizard, Grenoble (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 70 days.

(21) Appl. No.: 16/207,614

(22) Filed: Dec. 3, 2018

(65) Prior Publication Data
US 2019/0204167 A1 Jul. 4, 2019

(30) Foreign Application Priority Data

Dec. 4, 2017 (FR) ...................................... 17 61600

(51) Int. Cl.
*G01K 17/00* (2006.01)
*G01J 5/34* (2006.01)
(Continued)

(52) U.S. Cl.
CPC .......... *G01K 17/003* (2013.01); *G01J 5/0025* (2013.01); *G01J 5/024* (2013.01);
(Continued)

(58) Field of Classification Search
CPC .... G01J 2005/345; G01J 5/0025; G01J 5/024; G01J 5/046; G01J 5/061; G01J 5/20;
(Continued)

(56) References Cited

U.S. PATENT DOCUMENTS

| 4,394,773 A | 7/1983 | Ruell |
| 4,429,413 A | 1/1984 | Edwards |

(Continued)

FOREIGN PATENT DOCUMENTS

| EP | 2385486 A1 | 11/2011 |
| EP | 2645403 A2 | 10/2013 |

(Continued)

OTHER PUBLICATIONS

A.K. Batra et al: "Present Status of Polymer: Ceramic Composites for Pyroelectric Infrared Detectors", Ferroelectrics, vol. 366, n°:1, 84-121, Oct. 21, 2008.

(Continued)

*Primary Examiner* — Chih-Cheng Kao
(74) *Attorney, Agent, or Firm* — Pearne & Gordon LLP

(57) ABSTRACT

Thermal pattern sensor comprising several pixels located on a substrate, each pixel comprising a pyroelectric capacitor, the pyroelectric capacitor comprising a pyroelectric material located between two electrically conducting electrodes, the pyroelectric material comprising a sol-gel matrix in which first particles made of a first material and second particles made of a second material are dispersed. The first material being chosen from among calcium, lanthanum, tantalum, barium, lead and/or strontium oxides, the second material being chosen from among titanium, antimony, tin, zinc, gallium, vanadium and/or manganese oxides.

23 Claims, 3 Drawing Sheets

(51) Int. Cl.
*H01L 37/02* (2006.01)
*G01J 5/04* (2006.01)
*G01J 5/00* (2006.01)
*G01J 5/02* (2006.01)
*G01J 5/06* (2006.01)
*G01J 5/20* (2006.01)
*G06K 9/00* (2006.01)

(52) U.S. Cl.
CPC .............. *G01J 5/046* (2013.01); *G01J 5/061* (2013.01); *G01J 5/20* (2013.01); *G01J 5/34* (2013.01); *G06K 9/0002* (2013.01); *H01L 37/02* (2013.01); *G01J 2005/345* (2013.01)

(58) Field of Classification Search
CPC ....... G01J 5/34; G01K 17/003; G06K 9/0002; H01L 37/02; H01L 37/025
See application file for complete search history.

(56) References Cited

U.S. PATENT DOCUMENTS

| | | | | |
|---|---|---|---|---|
| 4,940,897 | A | * | 7/1990 | Forster .................. H01L 37/025 228/123.1 |
| 6,278,138 | B1 | * | 8/2001 | Suzuki ............... G02B 6/12004 257/103 |
| 6,289,114 | B1 | | 9/2001 | Mainguet |
| 8,801,274 | B2 | | 8/2014 | Mainguet et al. |
| 2003/0211029 | A1 | * | 11/2003 | Someya ................. B82Y 30/00 423/447.3 |
| 2011/0031378 | A1 | * | 2/2011 | Hirose ................... H01L 31/10 250/208.1 |
| 2011/0280276 | A1 | | 11/2011 | Mainguet et al. |
| 2013/0260051 | A1 | * | 10/2013 | Iida ..................... C23C 18/1245 427/470 |
| 2016/0276569 | A1 | | 9/2016 | Aliane |
| 2018/0145396 | A1 | | 5/2018 | Benwadih et al. |
| 2018/0155508 | A1 | | 6/2018 | Benwadih et al. |
| 2018/0254185 | A1 | | 9/2018 | Benwadih et al. |

FOREIGN PATENT DOCUMENTS

FR 3044409 A1 6/2017
JP 06183855 A * 7/1994

OTHER PUBLICATIONS

U.S. Appl. No. 16/207,846; entitled "Capteur De Motif Thermique a Capacite Pyroelectrique", filed Dec. 3, 2018.
Preliminary French Search Report for Application No. 1761600, dated Oct. 12, 2018.

* cited by examiner

THERMAL PATTERN SENSOR WITH PYROELECTRIC CAPACITOR COMPRISING A SOL-GEL MATRIX AND METALLIC OXIDE PARTICLES

TECHNICAL DOMAIN AND PRIOR ART

The invention relates to a thermal patterns sensor, making use of the pyroelectric properties of a material, and advantageously forming a fingerprint sensor.

A fingerprint can be detected using "passive" sensors making use of a temperature difference between the finger and the sensor, as disclosed in documents U.S. Pat. Nos. 4,394,773, 4,429,413 and 6,289,114. The finger is in direct physical contact with the sensor at the ridges of the print. Heat transfer between the skin and the contact surface of the sensor takes place by conduction, which leads to a first variation of the temperature with time. The finger is not in direct physical contact with the sensor at the valleys of the print, therefore the heat transfer takes place through air that is rather a thermal insulator, which leads to a second smaller variation of temperature with time. The difference between these two variations of the temperature with time results in a difference between the signals measured by the pyroelectric capacitors, depending on whether they are under a valley or under a ridge of the print. Therefore the image of the print includes a contrast that depends on this difference.

However, these sensors have the disadvantage that they make a measurement that is only dependent on the difference between the temperature of the finger and the temperature of the sensor. Thus, after just a few seconds, the temperature of the finger and the temperature of the contact surface of the sensor become homogeneous, and it is no longer possible to obtain a satisfactory contrast.

It is also possible that the signal level obtained is zero when temperatures of the finger and the sensor are the same, or that the contrast of the captured images varies, which then causes problems with subsequent treatment of the images obtained (for example a temperature inversion causes an inversion of the image obtained).

Another active type of sensor offers a solution to this problem through the addition of heating elements under the contact surface of the sensor. Such a sensor is described for example in patent application EP 2 385 486 A1. The heating elements dissipate a certain quantity of heat in each pixel of the sensor and the temperature rise of the pixels is measured after a certain time. Therefore the temperature variation obtained is large at the valleys of the print where heat is transferred to the finger through air, and is smaller at the ridges of the print, where heat is transferred to the finger directly by conduction. The result is that the final temperature in the case of a pixel in the presence of a ridge of the fingerprint, where heat is absorbed by the skin, is lower than the case of a pixel in the presence of a valley of the fingerprint. This can improve the contrast of an image acquired using said sensor, and maintain it over time.

The elements described above for fingerprint detection are also applicable for detection of a thermal pattern other than a fingerprint, the element for which the thermal pattern is to be detected being located on the sensor during the measurement.

A thermal patterns sensor comprises heat detection means that may consist of pyroelectric elements, diodes, thermistances or any other element sensitive to temperature to convert a temperature variation into a variation of electrical current or potential.

More particularly, a pyroelectric type sensor comprises a matrix of pyroelectric capacitors placed on a substrate, for example made of glass. Each pyroelectric capacitor comprises a portion made of a pyroelectric material located between a lower electrode and an upper electrode. One electrode is raised to a constant potential, and forms a reference electrode. The other electrode collects pyroelectric charges, generated by the pyroelectric material in response to a temperature variation.

The pyroelectric material may for example be a polyvinylidene-trifluoroethylene denoted P(VDF-TrFE), a PVDF (polyvinylidene fluoride), a ceramic such as PZT (lead zirconate titanate), AlN, $BaTiO_3$ or ZnO. Other pyroelectric materials are possible, namely all materials that produce electric charges as a function of a pyroelectric parameter. The upper electrode is covered with a protection layer on which the element of which the thermal pattern is measured, for example a finger, will be positioned during the measurement.

In the case of an active thermal sensor, the sensor is also provided with a heating element generally made from the same electrically conducting layer as that used to make the upper electrode. For example, this heating element is made in the form of a coil partially surrounding the upper electrodes and capable of heating the pyroelectric capacitors laterally at the upper electrodes.

Each pyroelectric capacitor forms a transducer that translates a variation of the temperature with time into an electric signal such as a difference in electrical potentials.

When a temperature variation $\Delta T$ is applied to the portion of pyroelectric material, this temperature variation $\Delta T$ causes the development of an additional electric field within the pyroelectric capacitor, generating charges $\Delta Q$ between the electrodes such that:

$$\Delta Q = S\gamma \Delta T \tag{1}$$

The parameter S corresponds to the surface area of the portion of pyroelectric material facing each of the electrodes. The parameter $\gamma$ corresponds to the pyroelectric coefficient of the pyroelectric material of the portion. For example, the pyroelectric coefficient $\gamma$ of PVDF is between 20 and 35 $\mu C/m^2/K$ for a temperature varying from 20° C. to 60° C.

The properties of the pyroelectric material, and the efficiency of pyroelectric detection, are defined by the merit figure $F_v$ that in the case of a thin layer is:

$$F_v = \gamma/\varepsilon_0\varepsilon_r$$

in which:
$\gamma$ the pyroelectric coefficient,
$\varepsilon_r$ the dielectric permittivity of the pyroelectric layer,
$\varepsilon_0$ the dielectric permittivity of a vacuum.

Therefore, the pyroelectric coefficient of the pyroelectric material has to be increased and/or its dielectric permittivity has to be reduced if the pyroelectric properties of the sensor are to be improved, and to obtain the highest possible merit factor.

PRESENTATION OF THE INVENTION

One purpose of this invention is to disclose a thermal pattern sensor that has a structure compatible with the manufacture of a passive or active type sensor, and for which the pyroelectric properties are better than with prior art.

To achieve this, this invention discloses a thermal pattern sensor comprising several pixels located on a substrate, each pixel comprising a pyroelectric capacitor, the pyroelectric capacitor comprising a pyroelectric material located between two electrically conducting electrodes, the pyroelectric material comprising a sol-gel matrix made of metal oxide in which the first particles made of a first material and second particles made of a second material are dispersed.

the first material being chosen from among calcium, lanthanum, tantalum, barium, lead and/or strontium oxides, the second material being chosen from among titanium, antimony, tin, zinc, gallium, vanadium and/or manganese oxides.

The invention is fundamentally different from prior art due to the nature of the pyroelectric material. Such a material is particularly advantageous.

The sol-gel matrix made of a metal oxide has a low dielectric permittivity εr. It also has a higher pyroelectric coefficient than PVDF classically used in pyroelectric capacitors.

The presence and the choice of first particles and second particles leads to the creation of a dipolar moment within the sol-gel matrix, which increases the coefficient pyroelectrically perpendicular to the electrodes/pyroelectric material. The result obtained is a capacitor with high thermal conductivity of the pyroelectric material perpendicular to the electrodes/pyroelectric material stack and good thermal insulation of the pyroelectric material parallel to the electrodes/material stack. The pyroelectric capacitor according to the invention has improved pyroelectric properties.

Advantageously, the sol-gel matrix is made of at least one oxide chosen from among aluminium oxides, silicon oxides, gallium oxides and zirconium oxides. Such matrices, and particularly a silicon matrix, have low permittivity.

Advantageously, the pyroelectric material is chosen from among the following materials:
- a sol-gel matrix made of aluminium oxide with first particles made of strontium oxides and second particles made of zinc oxide,
- a sol-gel matrix made of silicon oxide with first particles composed of strontium oxide and second particles made of zinc oxide,
- a sol-gel matrix made of silicon oxide with first particles composed of strontium oxide and second particles made of vanadium oxide,
- a sol-gel matrix made of aluminium oxide with first particles made of strontium oxide and second particles made of vanadium oxide,
- a sol-gel matrix made of silicon oxide, first particles made of lead oxide and second particles made of titanium oxide,
- a sol-gel matrix made of aluminium oxide, first particles composed of strontium oxide and second particles made of titanium oxide, Advantageously, the distance between the first particles is less than 50 nm. The quantity of electric charges in the pyroelectric material increases with increasing number of the particles and reducing distance between them.

Advantageously, the pyroelectric material comprises 30% to 70% by mass of sol-gel matrix, 30% to 50% by mass of first particles and 10% to 20% by mass of second particles.

Even more advantageously, the pyroelectric material comprises 40% by mass of sol-gel matrix, 40% by mass of first particles and 20% by mass of second particles.

Advantageously, the surface porosity of the pyroelectric material is equal to more than 15% of the total surface area of the pyroelectric material. Such porosity can reduce the dielectric permittivity and also the thermal conductivity, in a plane parallel to the electrodes/pyroelectric material stack.

Advantageously, the thickness of the pyroelectric material varies from 20 nm to 3 μm. Such thicknesses are sufficient for the intended applications.

Advantageously, one of the electrically conducting electrodes of each pixel is electrically connected to a fixed electrical potential.

Advantageously, the sensor comprises at least one heating element electrically insulated from the electrically conducting electrodes and located facing at least part of the pyroelectric material such that the pyroelectric material is located between the heating element and the substrate.

Advantageously, the sensor is a fingerprint sensor.

The invention also relates to a method for preparation of a pyroelectric material as defined above, comprising the following steps in sequence:
  a) supply a substrate,
  b) deposit a sol-gel solution on the substrate, comprising polymeric precursors of the sol-gel matrix, a solvent, first particles made of a first material and second particles made of a second material, and evaporation of the solvent so as to form a pyroelectric material, the first material being chosen from among calcium, lanthanum, tantalum, barium, lead and/or strontium oxides, the second material being chosen from among titanium, antimony, tin, zinc, gallium and/or manganese oxides, The different components of the pyroelectric material will mix in solution. Demixing begins in the dissolution step. However, at this stage the elementary components are at a distance from each other. Evaporation of the solvent during deposition, in a second step, and then the annealing step will significantly separate and increase the size of the different components made of elementary oxides (demixing), due to the difference in their surface energy. The pyroelectric material obtained has a high pyroelectric coefficient and a low permittivity.

The sol-gel deposition method has the advantage of being simple to implement and inexpensive.

Advantageously, after step b), a heat treatment at a temperature of at least 150° C., for example between 150° C. and 250° C., is then done on the pyroelectric material. Such temperatures are compatible with many polymer substrates.

During the heat treatment, the solvent evaporates and/or organic species originating from synthesis precursors disappear, which increases the porosity of the pyroelectric material. This heat treatment step also improves demixing of components of the pyroelectric material.

Advantageously, the heat treatment temperature is at least 400° C., for example from 400° to 500° C. Such temperatures are sufficient to obtain a high surface porosity (more than 28%) and therefore a material with a low permittivity, of the same order of magnitude as the permittivity of amorphous materials.

A crystallisation step, either by UV laser or by thermal annealing at a temperature of about 650° C. can be performed to make the pyroelectric material crystalline.

Advantageously, the sol-gel solution in step b) is obtained by performing the following steps:
  a1) Preparation of a solution comprising metal salts and a solvent, preferably an organic solvent, and mixing of the solution until the metal salts have dissolved in the solvent, so as to form metal ions.
  b1) Add a chelating agent, and possibly a complexing agent to the solution obtained in step a1), so as to form metal complexes from the metal ions and the chelating agent.

c1) Mix and stir the solution, preferably at a temperature of more than 50° C., so as to polymerise the metal complexes and to obtain a sol-gel solution containing the polymeric precursors.

the first particles and/or the second particles being added during one of steps a1, b1) or c1) or after step c1).

Advantageously, the chelating agent is acetic acid or butyric acid. Such a reagent is easily found off the shelf.

Advantageously, the complexing agent is ethanolamine or ethylene glycol. Such a reagent is easily found off the shelf.

Advantageously, the metal salts are metal acetates and/or metal nitrates and/or metal chlorides. These metal salts are available off the shelf and are often less expensive than the metal alkoxides conventionally used in sol-gel processes. Metal acetates will advantageously be used. The use of metal acetates rather than metal alkoxides can give a larger choice of metallic elements to form the sol-gel matrix. The use of metal acetate makes it possible to supply both the metal salt and at least part of the chelating agent. Furthermore metal acetates are stable in the presence of water and can be used without needing to work in a glovebox, which facilitates the preparation process.

The invention also relates to a method for fabrication of a thermal pattern sensor comprising the following steps in sequence:
supply a substrate,
form a first electrode,
deposit a pyroelectric material on the first electrode according to step b) as described above,
form a second electrode,
possibly, form a dielectric layer and form a heating element,
possibly, form a protection layer.

BRIEF DESCRIPTION OF THE DRAWINGS

This invention will be better understood after reading the description of example embodiments given purely for information and that are in no way limitative with reference to the appended drawings on which.

The different parts shown on the figures are not necessarily all at the same scale, to make the figures more easily understandable.

The different possibilities (variants and embodiments) must be understood as not being mutually exclusive and can be combined with each other.

DETAILED PRESENTATION OF PARTICULAR EMBODIMENTS

Figure 1:
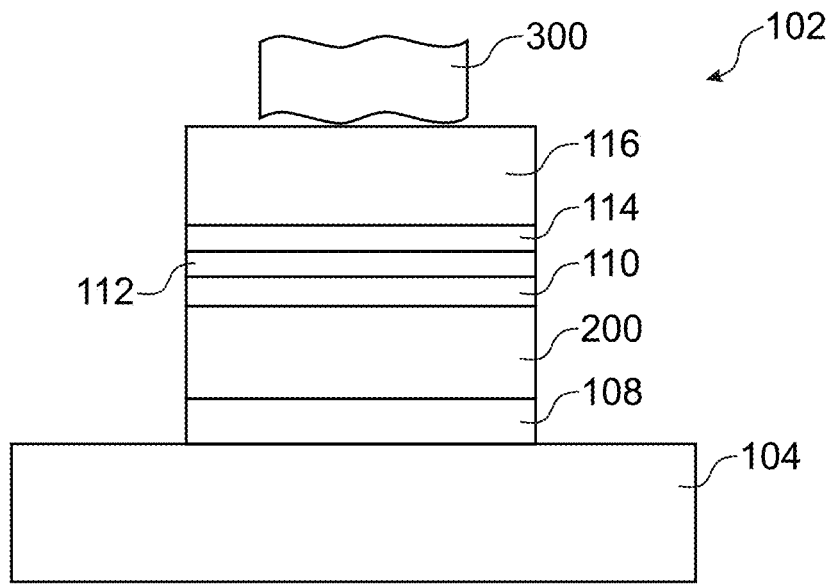
FIG. 1 diagrammatically shows a sectional view of a pixel of a thermal pattern sensor, according to a particular embodiment of the invention, FIG. 2 diagrammatically shows a sectional view of a pyroelectric layer of a thermal pattern sensor according to a particular embodiment of the invention, FIG. 3 diagrammatically shows a sectional view of a pyroelectric layer of a thermal pattern sensor, according to another particular embodiment of the invention, FIG. 4 diagrammatically shows a sectional view of a pyroelectric layer of a thermal pattern sensor, surrounded by two electrodes, according to a particular embodiment of the invention, FIG. 5 diagrammatically shows a top view of metal lines forming the lower electrode and metal lines forming the heating elements, according to a particular embodiment of the invention.

Refer firstly to FIG. 1 that represents a sectional view of a part of a pixel 102 of a thermal pattern sensor.

The Substrate 104,

The pixel 102 is made on a substrate 104 for example made of glass or a semiconducting material (for example silicon).

The substrate 104 can also be a flexible substrate, for example based on polyimide or PEN (polyethylene naphthalate) or PET (polyethylene terephthalate), on which electronic elements of the sensor, such as "Thin Film Transistors" (TFT), are made using the printed electronics technology (for example manufacturing using inkjet type write heads) or by lithography.

Glass substrates can also be used. For example a substrate of the "Eagle XG Slim Glass Substrates" type marketed by the Corning company can be used.

The Pixels 102:

A single pixel is represented on the substrate 104 represented on FIG. 1 to make the figure more easily understandable, but the substrate of a thermal pattern sensor comprises a plurality of pixels 102. The pixels 102 of the sensor are made by forming a matrix made of several rows and several columns of pixels 102. The pitch of the pixels 102 in the plane of the substrate 104 may for example be between about 50 µm and 100 µm. In the case of a sensor with resolution equal to 500 dpi ("dots per inch"), the pitch of the pixels 102 is equal to 50.8 µm.

Each pixel 102 of the sensor comprises thermal measurement or detection means formed by a pyroelectric capacitor. Each pyroelectric capacitor comprises a pyroelectric material 200 located between a lower electrode 108 and an upper electrode 110. The capacitor may be a horizontal capacitor or a vertical capacitor.

Figure 2:
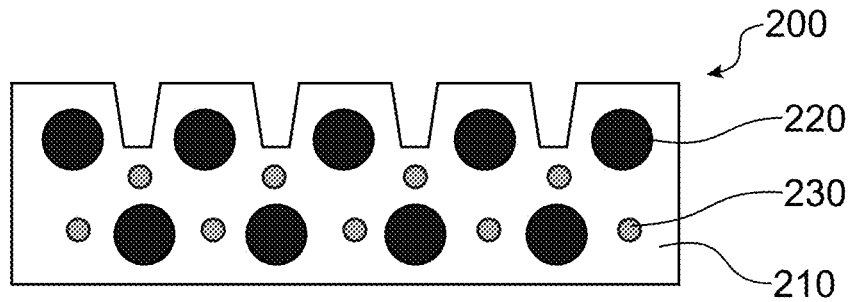
Figure 3:
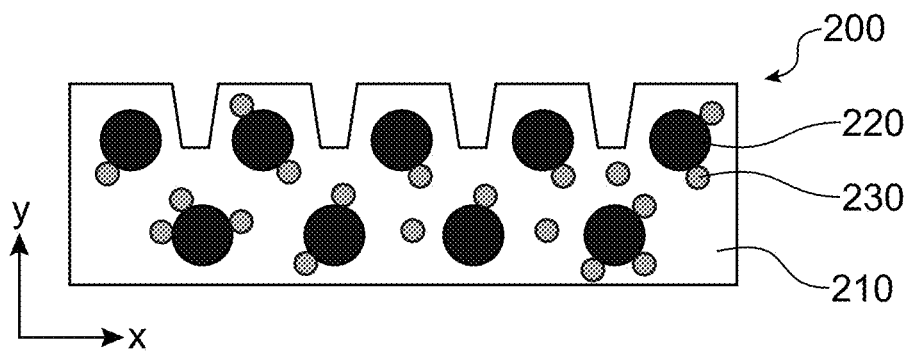
Figure 4:
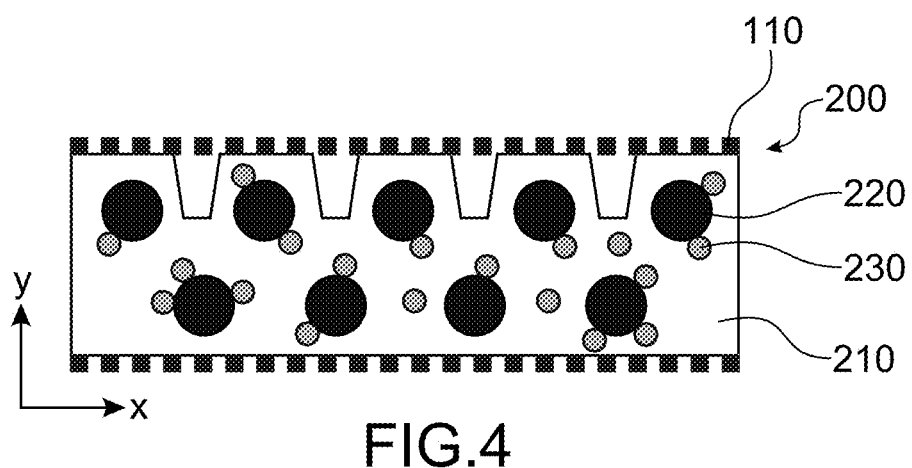

The Pyroelectric Material 200:

As represented on FIGS. 2, 3 and 4, the pyroelectric material 200 is a thin sol-gel layer comprising:
first particles 220 made of a first material (material A), the first material being chosen from among calcium, lanthanum, tantalum, barium, lead and/or strontium oxides,
second particles 220 made of a second material (material B), the second material being chosen from among titanium, antimony, tin, zinc, gallium, vanadium and/or manganese oxides,
a sol-gel matrix 210 made of a third material (material C) based on aluminium oxide, silicon oxide, gallium oxide and/or zirconium oxide, and being preferably porous.

The sol-gel material 210 is a material different from the first particles 220 and the second particles 230. The first, second and third materials are different.

The sol-gel matrix 210 is an amorphous material made of a metal oxide. It has a low dielectric permittivity $\varepsilon r$ and advantageously a very low pyroelectric coefficient. The person skilled in the art will choose a compatible metal oxide with the lowest possible relative permittivity, in other words less than 30 and preferably less than or equal to 15. Preferably, the matrix is made of aluminium oxide and/or silicon oxide and/or zirconium oxide. The permittivity of an $Al_2O_3$ matrix is of the order of 8-9, and the permittivity of a $ZrO_2$ matrix is 15. The permittivity of an $SiO_2$ matrix is of the order of 4. For comparison purposes, the permittivity of PVDF is 10.

The pyroelectric coefficient of the pyroelectric material obtained varies from 30 to 80 $\mu C/(m^2 K)$ or even from 40 to 100 $\mu C/(m^2 K)$, in other words its pyroelectric coefficient is between that of PVDF (from 20 to 35 $\mu C/(m^2 K)$) and that of ceramics. For example, the pyroelectric coefficient of $BaTiO_3$ is of the order of 100 $\mu C/(m^2 \cdot K)$), but its permittivity is about 1000, which strongly reduces its merit figure.

A porous sol-gel matrix will preferably be chosen. The increase in porosity reduces both the dielectric permittivity and thermal conductivity in a plane parallel to the surface of the substrate (x axis on FIG. 3). Preferably, the surface porosity of the pyroelectric material is more than 15% of the total surface area of the pyroelectric material.

The person skilled in the art will aim to have a sufficient quantity of sol-gel material in the pyroelectric material so as to reduce the global permittivity of the layer (preferably between 30% and 70% by mass, for example of the order of 40% by mass).

The sol-gel matrix 210 includes segregation of the first particles 220 and/or segregation of the second particles 230. Particles refers to elements with micrometric or nanometric dimensions and a spherical, cylindrical or ovoid shape.

The first particles 220 and the second particles 230 make it possible to increase the thermal conductivity perpendicular to the surface of the substrate 104 (γ axis on FIG. 3).

The porosity of the sol-gel matrix and the presence of first particles 220 and second particles 230 have a synergetic effect leading to an improvement in the detection resolution and sensitivity.

The first particles 220 are made of an element with a large ionic radius (for example an ionic radius larger than 130 μm), in oxide form. Preferably, the distance between the first particles 220 is small (less than 50 nm). The first particles 220 have good pyroelectric properties. The large dimensions of the first particles 220 vary from 50 to 100 nm, and preferably from 10 to 70 nm. Preferably, the first particles 220 are made of barium oxide, lead oxide and/or strontium oxide.

The second particles 230 are made of an element with an average ionic radius (for example an average ionic radius less than 130 μm), in oxide form. These second particles 230 improve the pyroelectric coefficient of the layer of sol-gel material. The large dimension of the particles 230 varies from 10 to 200 nm, and preferably from 20 to 50 nm. Preferably, the second particles 230 are made of antimony oxide, vanadium oxide, titanium oxide and/or zinc oxide. Vanadium oxide means $V_2O_5$ or $VO_2$. The dielectric permittivity of $Sb_2O_3$ is about 12 which is particularly advantageous to reduce the permittivity of the pyroelectric material.

The person skilled in the art will choose the size and the number of first particles 220 and/or second particles 230 as a function of the quantity of electric charges required in the pyroelectric material 200.

The difference in ionic radius between the first particles and the second particles destabilises the electrical equilibrium that works on the scale of the amorphous or crystalline structure. The presence of first particles 220 and second particles 230 leads to creation of the dipole moment within the sol-gel matrix. The pyroelectric material obtained has a preferably non-centrosymmetric structure.

The matrix may also contain organic dielectric residues.

The matrix has domains of each of its elements. We refer to an auto-organised matrix. For illustrative purposes, the auto-organised matrix may contain a sol-gel matrix 210 based on aluminium oxide and/or silicon oxide and/or zirconium oxide, first particles 220 made of Sr oxide, Pb oxide and/or Ba oxide and second particles 230 made of Zn oxide, and/or Ti oxide and/or Va oxide.

One of the following associations will be chosen in preference:
- a sol-gel matrix 210 made of aluminium oxide with first particles 220 made of strontium oxides and second particles 230 made of zinc oxide,
- a sol-gel matrix 210 made of silicon oxide with first particles 220 made of strontium oxide and second particles 230 made of zinc oxide,
- a sol-gel matrix 210 made of silicon oxide with first particles 220 made of strontium oxide and second particles 230 made of vanadium oxide,
- or a sol-gel matrix 210 made of aluminium oxide with first particles 220 made of strontium oxide and second particles 230 made of vanadium oxide, It would also be possible to choose a matrix 210 made of $SiO_2$, first particles 220 made of lead oxide and second particles 230 made of titanium oxide or a matrix 210 made of aluminium oxide, first particles 220 made of strontium oxide and second particles 230 made of titanium oxide.

Preferably, the pyroelectric material comprises 30% to 70% by mass of sol-gel matrix 210, 30% to 50% by mass of first particles 220 and 10% to 20% by mass of second particles 230.

The thickness of the pyroelectric material 200 varies for example from 20 nm to 5 μm. Preferably, it varies from 10 nm to 3 μm, more preferably from 100 nm to 2 μm, and even more preferably it is equal to 500 nm. The thickness of deposited pyroelectric material 200 is controlled because this thickness is the thickness of the pyroelectric capacitor (distance between electrodes) and is directly involved in the calculation of the useful pyroelectric capacitor C to extract the permittivity. The thickness is not related to the pyroelectric coefficient.

The Electrodes 108, 110:

Each of the lower electrode 108 and the upper electrode 110 comprises at least one electrically conducting material. Each of the electrodes 108, 110 can comprise at least one of the following materials: Ti, Pt, Ni, Au, Al, Mo, Ag, AlSi, AlCu, TiAu. One of the electrodes 108, 110, advantageously the upper electrode 110, or each of the two electrodes 108, 110, can be formed from a stack of several electrically conducting materials, for example a Ti/TiN or Ti/TiN/AlCu, or Ti/Au stack.

The thickness of the each of the electrodes 108, 110 may for example be between about 0.01 μm and 1 μm. The thickness of each of the electrodes 108, 110 can be higher, for example up to about 5 μm, particularly when these electrodes are made by printing using materials such as silver, copper, carbon or PEDOT (poly(3,4-ethylenedioxythiophene).

As a non-limitative illustration, the upper electrode 110 and/or the lower electrode 108 is a layer with a thickness equal to about 0.2 μm, made of titanium and/or molybdenum and/or aluminium and/or a conducting oxide such as ITO (indium tin oxide) and/or a conducting polymer.

As a non-limitative illustration, the upper electrode 110 and/or the lower electrode 108 is formed from one or several Ti/TiN type stacks with a Ti thickness between about 50 nm and 500 nm and a TiN thickness between about 10 nm and 500 nm. It would also be possible to use a Ti/Au stack with a Ti thickness equal to 5 nm and an Au thickness equal to 50 nm.

The upper electrode 110 and/or the lower electrode 108 is, for example, in the form of metal lines parallel to each other. For example, such lines can be made of gold.

The Dielectric Layer 112:

The upper electrode 110 is covered by a dielectric layer 112. The thickness of the dielectric layer varies for example from 0.1 µm to 5 µm. For example, the dielectric layer may be made of polyimide. It electrically isolates the upper electrode 110 from the heating elements 114.

Figure 5:
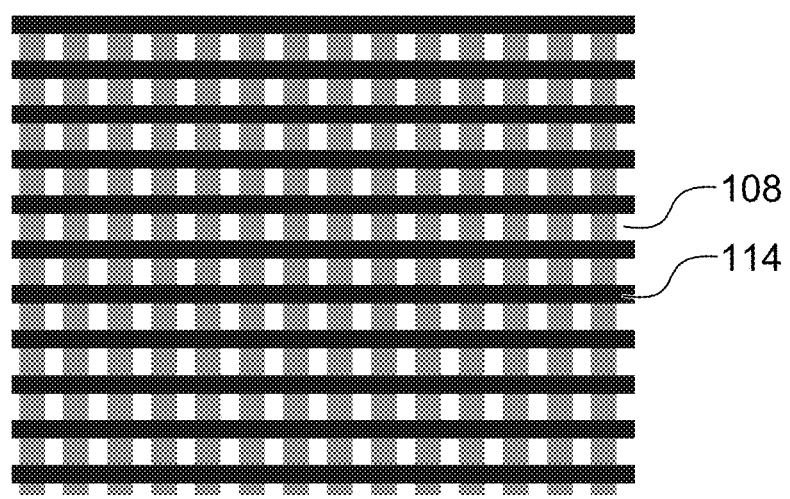
Figure 6A:
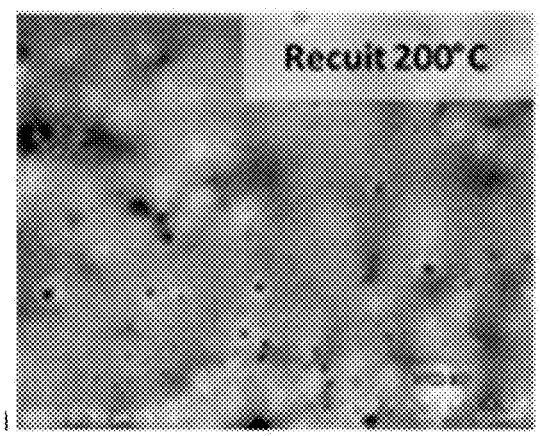
FIGS. 6A to 6D represent plates obtained by scanning electron microscopy of the surface of a pyroelectric material obtained according to a particular embodiment of the invention, for different annealing temperatures.
Figure 6B:
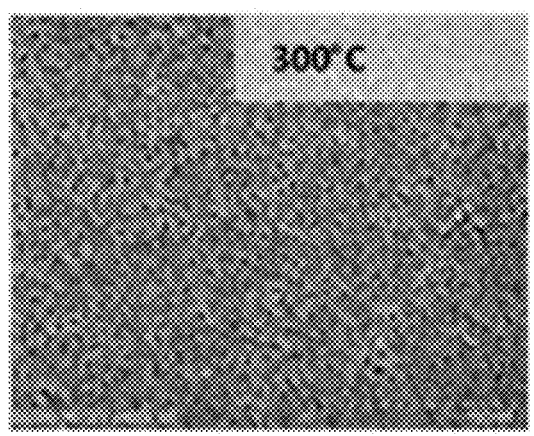
Figure 6C:
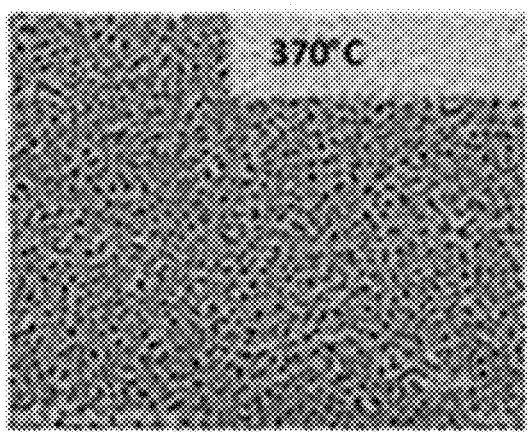
Figure 6D:
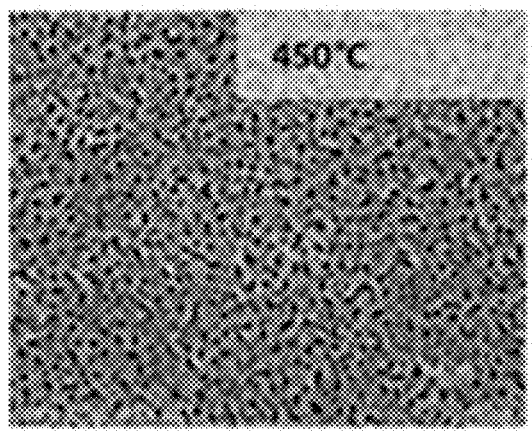
Figure 7:
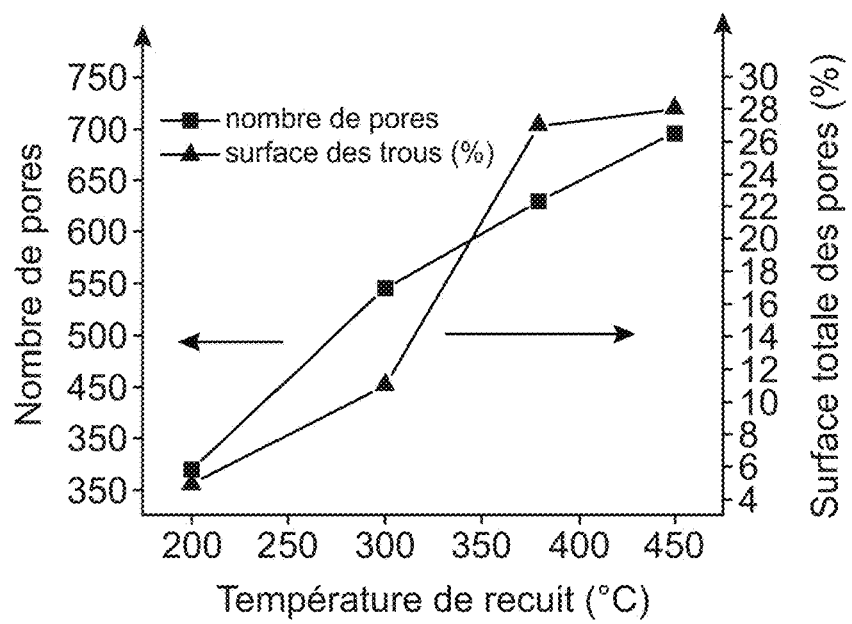
FIG. 7 represents the number of pores and the percentage of pores on the surface as a function of the annealing temperature of a pyroelectric material obtained according to a particular embodiment of the invention.

The Heating Elements 114:

In the embodiment in which the sensor is capable of active thermal detection, in addition to the previously described elements, the sensor also includes heating elements 108 dissipating a certain quantity of heat in the pixels 102, and particularly in the pyroelectric material 200. For example, these heating elements 108 are formed by electrically conducting portions originating from the same layer as that used to make the upper electrodes 110 or the lower electrodes 108. The material(s) used to make the heating element 114 can be chosen from among the following materials: Ti, Pt, Ni, Au, Al, Ag, AlSi, AlCu. For example, the heating elements 114 are made by a deposition of metallic ink, for example comprising silver, deposited by printing. The heating elements 114 are, for example, in the form of metal lines parallel to each other. As represented on FIG. 5, the lines forming the heating elements may be perpendicular to the lines of the lower electrode 108.

The heating element 114 may comprise a Ti layer with a thickness of about 3 nm to 10 nm and an electrically conducting layer made of AlSi or AlCu and with a thickness varying from 10 nm to 70 nm, for example from 10 nm to 50 nm. In such a configuration, the AlSi or AlCu layer protects the titanium layer against oxidation. It would also be possible to choose a 5 nm thick layer of titanium and a 50 nm thick layer of gold.

For example, the thickness of the heating elements 114 varies from 0.03 µm to 1 µm, and preferably from 30 to 70 nm. The person skilled in the art will choose a material with a resistance such that it can be properly heated at low voltage (typically less than 10V).

Each of the heating elements 114 forms a resistive metallic element (for example electrical resistance between about 10Ω and 100Ω) associated with a pixel 102 and that can be used to heat this pixel 102 independently of the heating elements 114 associated with the other pixels 102. When the device makes a detection, the heating elements 114 can be used to dissipate a certain quantity of heat in the pixels 102, and particularly in the pyroelectric material of the layer 113. In each pixel 102, the portion 200 of pyroelectric material is heated by circulating a current to in the heating element 114 forming the heating resistance of each of the pixels 102.

The pyroelectric material 200 is heated by circulating a current in the heating element 114 forming the heating resistance of each of the pixels 102. In order to achieve good detection sensitivity, translating a large temperature difference between a pixel in contact with a ridge of the fingerprint and a pixel in contact with a valley of the fingerprint, electrical powers injected into the heating element can vary from 0.5 mW/pixel to 5 mW/pixel in the case of pixels with sides with dimensions equal to about 50 µm (as is the case for a standard fingerprint sensor with resolution equal to 500 dpi).

The Protection Layer 116:

The heating elements 114 and the parts of the dielectric layer 112 on which the heating elements 114 are not present are advantageously covered by a protection layer 116 for example corresponding to a laminated layer of PET or any other material adapted for fabrication of this layer. Other materials can also be envisaged for this layer 116, for example such as polyimide, PVDF and/or its copolymers, PMMA, etc. The material(s) used and the thickness of the layer are chosen to achieve good heat transfer from the front face of the protection layer 116 to the pyroelectric capacitor. Thus, the protection layer 116 is made such that its thermal resistance is not too high (because heat would not pass through it), and that its thermal conductance is not too high (because in this case heat would escape through the sides to other pixels causing diathermy within the sensor), and is not too thick (to obtain heat transfer passing from the front towards the pyroelectric capacitor) or too thin (nevertheless the thickness of the layer must be sufficient so that its protection role is satisfied). The thickness of the protection layer 116 may vary from a few microns (for example 5 µm) to about 100 µm. The thickness may for example be of the order or 10 µm. Alternatively, the protection layer 116 may correspond to a Diamond Like Carbon (DLC) layer with a thickness of less than about 1 µm.

The top face of the protection layer 116 corresponds to the surface on which there is the thermal pattern to be detected, for example a finger for which the fingerprint is to be detected. The part of a finger 300 with the valleys and the ridges of the fingerprint are shown in FIG. 1.

Method of Fabrication of the Pyroelectric Material:

The layer of pyroelectric material is obtained by deposition of a sol-gel solution.

The sol-gel solution comprises precursor polymers of the sol-gel matrix, a solvent, first particles of a first material and second particles of a second material.

The precursor polymers are obtained by polymerisation of metal complexes obtained by mixing metallic salts, a chelating agent and possibly a complexing agent.

Preferably, the sol-gel solution can be obtained by performing the following steps:

a1) Preparation of a solution comprising metal salts and a solvent, preferably an organic solvent and even more preferably a polar organic solvent, and mixing of the solution until the metallic salts are dissolved in the solvent, so as to obtain metal ions.

b1) Add a chelating agent, and possibly a complexing agent to the solution obtained in step a1), so as to form a metal complex from the metal ions and the chelating agent.

c1) Mix and stir the solution at a temperature of more than 50°, for example at 70° C., so as to polymerise metal complexes and to obtain a sol-gel solution containing the precursor polymers.

the first particles and/or the second particles being added during one of steps a1, b1) or c1) or after step c1).

For example, the solvent is 2-isopropoxyethanol, methanol, 2 methoxyethanol. Preferably, it is 2-isopropoxyethanol that is a "green" non-CMR (carcinogenic mutagenic reprotoxic) solvent. The chemical nature of the precursor polymers can influence distances between the first particles and/or between the second particles.

Preferably, the metal salts are chosen from among metal acetates and/or metal nitrates and/or metal chlorides.

The use of different natures of counterions can increase disorder within the layer, i.e. segregation of the different constituents.

Metal nitrates facilitate formation of the hydroxide bond, but they are difficult to eliminate at low temperature. Therefore the annealing step must be performed at a higher temperature.

The decomposition temperatures of chlorides are high (of the order of 500° C.).

Advantageously, metal acetates are used because they are insensitive to the presence of water in solution and are therefore more stable. There is no need to implement the process under an inert atmosphere. Advantageously, after partial decomposition, the acetates form electrically stable oxides. Layers can be made reproducibly as a result of their use.

The chelating agent added in step b1) may be butyric acid. Preferably, it is acetic acid. It avoids the precipitation of metal ions during the sol-gel process, and prolongs the life of the solution prepared for use of sol-gel process.

The sol-gel solution may also comprise a complexing agent to stabilise and facilitate the polymerisation step of the process. This may be ethylene glycol. It is preferably ethanolamine.

More particularly, for illustrative purposes and non-limitatively, the sol-gel solution can be prepared by performing the following steps:
- add metal acetates and/or metal nitrates and/or metal chlorides to 2-methoxyethanol, while stirring, at 50° C., until their dissolution,
- form a metal complex by the addition of acetic acid and ethanolamine into the solvent, at 70° C.; the pH is 5, the reaction can last for a few hours; acetate ions and metal ions are formed;
- polymerise the metal complexes, stirring at 70° C.;
- add first and/or second particles in step a1), b1), or c1) or after step c1).

The solution is then deposited using any deposition technique classically used for sol-gel methods. For example, the solution is deposited by spin-coating. The deposit leads to the formation of a sol-gel layer.

The thin layers obtained using a liquid method are generally complex: the method of maturing the solution, annealing and their impact on the composition, and the porosity will play a primordial role on the structure, morphology and the specific surface area of these layers and on the distribution of particles. These morphological parameters will be closely related to electrical and/or pyroelectric performances.

Advantageously, a heat treatment is done after deposition and formation of the sol-gel layer. The annealing step eliminates organic residues originating from synthesis (for example additives and/or solvent), that can influence pyroelectric properties and/or the permittivity of the layer.

Heat treatment preferably takes place at a temperature higher than 150° C., for example between 150° C. and 200° C., or between 150° C. and 250° C., or even more preferably between 400° C. and 500° C., for example of the order of 450° C. Temperatures between 150° C. and 200° C. could advantageously be used for annealing on polymer substrates.

The annealing step can also increase the porosity of the sol-gel layer. Pores are formed in the materials obtained by the liquid method by superposition of three mechanisms: decomposition by sublimation of elements originating from the solution (for example precursors, stabiliser, or additive), evaporation of the solvent and creation of gas bubbles. The formation of pores begins with evaporation of the solvent. Depending on the temperature, the solvent can evaporate more or less suddenly, thus changing the shape and size of the pores. The annealing temperature has an influence on material movements during evaporation of the solvent and decomposition of the precursors.

The number of pores and their surface areas increase with the annealing temperature (FIGS. 6A to 6D and FIG. 7). Images were processed using the ImageJ software.

For temperatures varying from 200° C. to 350° C., depletion of organic elements of the sol-gel layer is observed, and then the metallic elements release chelating elements. The structure dehydrates, the number of holes increases.

If the temperature is higher than 350° C., it is possible to have a surface porosity equal to more than 15% of the surface of the deposited layer of pyroelectric material. Advantageously, demixing of oxides and enlargement of the first particles 220 and the second particles 230 is observed for temperatures equal to more than 350° C. The porosity can also modify the distribution of elements in the layer.

More advantageously, a temperature equal to more than 400° C. is chosen so that the porosity is more than 25% of the surface area. The permittivity of the sol-gel layer is thus significantly reduced.

For example, the pore size varies from 2 nm to 10 nm.

Annealing can be done for a duration of between a few minutes (for example 5 minutes) and a few hours (for example 2 hours). For example, annealing can be done at 150° C. for 10 minutes.

Annealing can be done in a furnace.

It can also be done by absorption of intense light (laser, xenon flash, infrared or photonic), which improves demixing of the different oxides.

Annealing can also be done with ultra-violet radiation.

It is also possible to anneal at a temperature of up to 700° C., for example during 1 h, depending on the required crystallographic state. For example, a crystallisation step, either by UV laser or by thermal annealing at a temperature of about 650° C., can be used to make the pyroelectric material crystalline. Even if this significantly increases the pyroelectric coefficient of the pyroelectric material, the permittivity reduces because increase of the particle size and therefore demixing are facilitated, so that the matrix can be in excess.

Method of Fabrication of the Thermal Pattern Sensor:

A method of fabricating a thermal pattern sensor comprising such pyroelectric capacitors will now be described.

The sensor is made from substrate 104. The material of the substrate 104 (glass, semiconductor, plastic, etc.) is chosen depending on the technology used to make the different electronic elements of the sensor. For example, it would be possible to use an alternative 248 nm UV laser type annealing under a fluence of 50 mJ/m² to be able to integrate crystalline materials on flexible plastic substrates.

The substrate 104 is firstly cleaned so as to eliminate organic residues present on the substrate. The type of cleaning used will depend on the material of the substrate 104.

The second step consists of depositing a first electrically conducting layer, for example a metallic layer, on the front face of the substrate 104, from which the electrode 108 will be made. The layer may be deposited in the PVD vapour phase, by sputtering, screen printing, spray, or even by inkjet, depending on the materials and thicknesses to be deposited. When the layer is formed by a PVD deposit, the thickness of the layer will for example be equal to about 100 nm to 2 µm. In general, the thickness of the layer is greater than or equal to about 50 nm. Other types of deposit can be used to make a layer with a thickness of more than about 2

µm. The structure of the electrodes 108 can be defined by using a photolithography and etching step of the layer.

The pyroelectric material is then formed on the first electrode using the process described above.

An electric field of between about 50 and 150 volts per micron of thickness is applied once for the entire lifetime of the pyroelectric capacitor, so that the pyroelectric material 200 can acquire its pyroelectric properties. Molecules inside the pyroelectric layer are oriented and remain oriented, even when this electric field is no longer applied to the material. The material can thus be polarised by applying an initial polarisation voltage to the terminals of the electrodes 108, 110. In preference, a thickness of pyroelectric material equal to or less than about 2 µm will be chosen to improve polarisation of the pyroelectric material of this capacitor, and the electric voltage level applied between the electrodes 108, 110 to make the initial polarisation of the entire pyroelectric material (when the pyroelectric material has to be initially polarised).

Portions of the pyroelectric material 200 are then defined by the use of photolithography and etching of the pyroelectric material. When the etching used corresponds to plasma etching, an $O_2$ plasma can be used alone or in combination with $SF_6$ (sulphur hexafluoride). Portions of pyroelectric material kept after application of this etching correspond to portions of the pyroelectric material located at the pixels 102 of the sensor.

As a variant, the portions can be made directly without an etching step, by localised deposition for example corresponding to a deposition by ultrasound spray, or by inkjet or by screen printing.

The second electrode or the upper electrode 110 is then deposited using deposition techniques that may be identical to or different from techniques used to deposit the first electrode.

One or several second electrically conducting layers intended to form the heating elements 118 are then deposited on the structure obtained at this stage of the process. The heating element 118 is then formed by etching the electrically conducting layer(s) previously deposited using the pattern of the heating element 118, for example in the form of a coil or in the form of a rectangular line. For example, a photolithography step followed by a plasma etching or wet etching step, are used to form the heating element 118. The layer is etched, for example through the use of plasma etching.

The material(s) that will be used to form the protection layer 116 is or are then deposited on the entire previously fabricated structure. Depending on the deposited material(s), the deposit(s) may for example be made by physical deposition (for example PVD) at low temperature, or by a wet method (for example by centrifuging, spraying or inkjet). When this or these protection materials are deposited locally, for example by spraying or by inkjet, the protection layer 116 is formed as soon as the deposit is made locally on the heating element 118 and on any parts of the pyroelectric material not covered by the heating element 118 (as is the case when the heating element 118 forms a coil located only above the portions 200), and there is no need to use etching of the deposited material(s) to form the layer 116.

Otherwise, the material(s) is (are) also deposited at the side of the portions of pyroelectric material, etching, for example plasma etching, is then applied to eliminate the parts of the material(s) deposited at the side of the portions, to thus enable access to the ends.

In the different examples described above, the sensor is used as a fingerprint detector. However, the sensor can be used to detect thermal patterns other than fingerprints, because each pixel 102 of the sensor reads the calorific capacitor placed above it regardless of the nature of the thermal pattern.

For example, the sensor can also be used to make an uncooled infrared imager. In this case the pixels 102 of the sensor are integrated into a CCD or CMOS type integrated circuit collecting electrical charges generated by the sensor. Such an imager also comprises an infrared lens filtering light arriving at the sensor. The imager comprises a device that successively blocks infrared light arriving at the sensor and then allows this light to pass, so that a temperature difference can be applied to the sensor (necessary considering the measurement made by the pyroelectric capacitors). Such a device may correspond to a "chopper", in other words a wheel in which a hole is formed rotating in front of the sensor. An absorber element may be added on the pyroelectric material to improve absorption of the received infrared radiation.

What is claimed is:

1. Thermal pattern sensor, comprising several pixels located on a substrate, each pixel comprising a pyroelectric capacitor, the pyroelectric capacitor comprising a pyroelectric material located between two electrically conducting electrodes,
   wherein the pyroelectric material comprises a sol-gel matrix made of metal oxide in which first particles made of a first material and second particles made of a second material are dispersed, wherein the first particles are different than the second particles,
   the first material being chosen from among calcium, lanthanum, tantalum, barium, lead and/or strontium oxides,
   the second material being chosen from among titanium, antimony, tin, zinc, gallium, vanadium and/or manganese oxides.

2. Sensor according to claim 1, wherein the sol-gel matrix is made of at least one oxide chosen from among aluminium oxides, silicon oxides, gallium oxides and zirconium oxides.

3. Sensor according to claim 1, wherein the pyroelectric material comprises a sol-gel matrix made of aluminium oxide with first particles made of strontium oxides and second particles made of zinc oxide.

4. Sensor according to claim 1, wherein the pyroelectric material comprises a sol-gel matrix made of silicon oxide with first particles composed of strontium oxide and second particles made of zinc oxide.

5. Sensor according to claim 1, wherein the pyroelectric material comprises a sol-gel matrix made of silicon oxide with first particles composed of strontium oxide and second particles made of vanadium oxide.

6. Sensor according to claim 1, wherein the pyroelectric material comprises a sol-gel matrix made of aluminium oxide with first particles made of strontium oxide and second particles made of vanadium oxide.

7. Sensor according to claim 1, wherein the pyroelectric material comprises a sol-gel matrix made of silicon oxide with first particles composed of lead oxide and second particles made of titanium oxide.

8. Sensor according to claim 1, wherein the pyroelectric material comprises a sol-gel matrix made of aluminium oxide, first particles made of strontium oxide and second particles made of titanium oxide.

9. Sensor according to claim 1, wherein the distance between the first particles is less than 50 nm.

10. Sensor according to claim 1, wherein the pyroelectric material comprises 30% to 70% by mass of sol-gel matrix, 30% to 50% by mass of first particles and 10% to 20% by mass of second particles.

11. Sensor according to claim 10, wherein the pyroelectric material comprises 40% by mass of sol-gel matrix, 40% by mass of first particles and 20% by mass of second particles.

12. Sensor according to claim 1, wherein the surface porosity of the pyroelectric material is more than 15% of the total surface area of the pyroelectric material.

13. Sensor according to claim 1, wherein the thickness of the pyroelectric material varies from 20 nm to 3 µm.

14. Method of preparing a pyroelectric material as defined in claim 1, comprising the following steps in sequence:
   a) supply a substrate,
   b) deposit a sol-gel solution on the substrate, comprising polymeric precursors of the sol-gel matrix, a solvent, first particles made of a first material and second particles made of a second material, and evaporation of the solvent so as to form a pyroelectric material,
   the first material being chosen from among calcium, lanthanum, tantalum, barium, lead and/or strontium oxides,
   the second material being chosen from among titanium, antimony, tin, zinc, gallium and/or manganese oxides.

15. Method according to claim 14, wherein a heat treatment is done on the pyroelectric material after step b), at a temperature of at least 150° C.

16. Method according to claim 14, wherein the sol-gel solution in step b) is obtained by performing the following steps:
   a1) Preparation of a solution comprising metal salts and a solvent, and mixing of the solution until dissolution of the metal salts in the solvent, so as to obtain metal ions,
   b1) Add a chelating agent to the solution obtained in step a1), so as to form metal complexes from the metal ions and the chelating agent,
   c1) Mix and stir the solution so as to polymerise the metal complexes and to obtain a sol-gel solution containing the polymeric precursors,
   the first particles and the second particles being added during one of steps a1, b1) or c1) or after step c1).

17. Method according to claim 16, wherein the chelating agent is acetic acid or butyric acid.

18. Method according to claim 16, wherein a complexing agent is added in step b1).

19. Method according to claim 16, wherein the metal salts are metal acetates, metal nitrates, and/or metal chlorides.

20. Sensor according to claim 1, wherein the sol-gel matrix is different than the first particles and the second particles.

21. Sensor according to claim 1, wherein the first particles range in size from 50 to 100 nm.

22. Sensor according to claim 1, wherein the second particles range in size from 10 to 20 nm.

23. Sensor according to claim 21, wherein the second particles range in size from 10 to 20 nm.

* * * * *